United States Patent

Hashimoto et al.

Patent Number: 5,756,191
Date of Patent: May 26, 1998

[54] EXCHANGE COUPLING FILM AND MAGNETORESISTANCE EFFECT ELEMENT

[75] Inventors: Susumu Hashimoto, Ebina; Yuzo Kamiguchi, Yokohama; Hiromi Fuke, Kawasaki; Hitoshi Iwasaki, Yokosuka; Tomomi Funayama, Fujisawa; Masashi Sahashi, Yokohama, all of Japan

[73] Assignee: Kabushiki Kaisha Toshiba, Kawasaki, Japan

[21] Appl. No.: 785,318

[22] Filed: Jan. 21, 1997

Related U.S. Application Data

[63] Continuation of Ser. No. 527,265, Sep. 12, 1995, abandoned.

[30] Foreign Application Priority Data

Sep. 13, 1994 [JP] Japan .................... 6-219144

[51] Int. Cl.$^6$ .................................... B32B 09/00
[52] U.S. Cl. ................ 428/209; 428/688; 324/252; 360/113
[58] Field of Search ............... 428/209, 688; 324/252; 360/113

[56] References Cited

U.S. PATENT DOCUMENTS

| | | |
|---|---|---|
| 4,103,315 | 7/1978 | Hempstead et al. |
| 5,014,147 | 5/1991 | Parkin et al. |
| 5,475,550 | 12/1995 | George ............ 360/113 |
| 5,514,452 | 5/1996 | Araki ............. 360/113 |
| 5,552,949 | 9/1996 | Hashimoto et al. .... 360/113 |

OTHER PUBLICATIONS

M. Takano et al., "Neutron diffraction study of artificial CoO–NiO superlattices," Appl. Phys. Lett., vol. 51, No. 3 (Jul. 20, 1987), pp. 205–206.

*Primary Examiner*—William Krynski
*Attorney, Agent, or Firm*—Finnegan, Henderson, Farabow, Garrett & Dunner, L.L.P.

[57] ABSTRACT

An exchange coupling film comprising a first antiferromagnetic film, a ferromagnetic film formed as superposed on the first antiferromagnetic film, and a second antiferromagnetic film formed in the interface between the first antiferromagnetic film and the ferromagnetic film, characterized in that the first antiferromagnetic film has a crystal structure selected from the group consisting of tetragonal, body-centered cubic, and NaCl type and the second antiferromagnetic film of γ phase M-Mn alloys with the crystal structure of face-centered cubic, wherein M stands for at least one element selected from the group consisting of Fe, Co, and Ni.

10 Claims, 3 Drawing Sheets

EXCHANGE COUPLING FILM AND MAGNETORESISTANCE EFFECT ELEMENT

This application is a continuation of application Ser. No. 08/527,265 filed Sep. 12, 1995, now abandoned.

BACKGROUND OF THE INVENTION

1. Field of the Invention

This invention relates to an exchange coupling film using the exchange coupling of an antiferromagnetic film and a ferromagnetic film and a magnetoresistance effect element such as a magnetic field detecting sensor or magnetic head which is provided with the exchange coupling film.

2. Description of the Related Art

At present, the study of a magnetic head using magnetoresistance effect for use in high-density magnetic recording has been eagerly conducted. As the material for a magnetoresistance effect element, the thin film of a 80 at %Ni20 at % Fe alloy (called Permalloy) has been generally used for a long time. In recent years, as new materials alternative thereto, an antiferromagnetically coupling type artificial lattice film obtained by interposing nonmagnetic layers one each between a multiplicity of superposed magnetic layers, for example, such as $(Co/Cu)_n$, and a spin valve film obtained by forming a film having a pair of magnetic layers opposed across a nonmagnetic layer to each other and magnetically pinning one of the opposed magnetic layers with an antiferromagnetic film or a hard film have been receiving a comprehensive study.

Since the magnetoresistance effect films which use these materials have magnetic domains, however, the Barkhausen noise arising from the domains puts a serious hindrance to the feasibilization of these films. Thus, studies are now under way with respect to several methods which are aimed at attaining the impartation of a single domain to a magnetoresistance effect film. Among these methods is a method which resides in pinning a magnetization in a specific direction by utilizing an exchange coupling of a magnetoresistance effect film which is a ferromagnetic substance and an antiferromagnetic substance. For example, various exchange couplings which use a γ-FeMn alloy as an antiferromagnetic substance have been proposed (U.S. Pat. No. 4,103,315 and U.S. Pat. No. 5,014,147). The γ-FeMn alloy, however, is deficient in resistance to corrosion particularly due to oxidation. In addition, the γ-FeMn alloy is at a disadvantage in suffering the exchange bias magnetic field to be deteriorated by aging. The exchange coupling films of this nature are also deficient in thermal stability because the blocking temperature $(T_B)$ at which the exchange bias magnetic field reaches zero is unduly low.

An exchange coupling film which uses such a Mn alloy as MnPt or MnRh alloy as an antiferromagnetic substance and an exchange coupling film which uses NiO as an oxide type substance are proposed in U.S. Pat. No. 4,103,315. The Mn alloy or the oxide NiO, however, is at a disadvantage in providing a fully satisfactory exchange bias magnetic field with a ferromagnetic substance.

The exchange coupling film using the exchange coupling of a ferromagnetic film and an antiferromagnetic film as described above has been heretofore utilized for the purpose of decreasing the Barkhausen noise of a magnetoresistance effect element, for example. The conventional exchange coupling films, however, are not fully satisfactory in terms of the size of an exchange bias magnetic field or the thermal stability, for example.

SUMMARY OF THE INVENTION

This invention which has been produced for the purpose of coping with these problems has for an object thereof the provision of an exchange coupling film possessing a large exchange bias magnetic field and, at the same time, permitting improvement of thermal stability and a magnetoresistance effect element furnished with this exchange coupling film and enabled to attain a stable output for a long time.

The exchange coupling film of this invention comprises a first antiferromagnetic film, a ferromagnetic film formed as superposed on the first antiferromagnetic film, and a second antiferromagnetic film formed in the interface between the first antiferromagnetic film and the ferromagnetic film and is characterized in that the first antiferromagnetic film has a crystal structure selected from the group of tetragonal, body-centered cubic, and NaCl type and the second antiferromagnetic film consists of the γ phase M-Mn alloys (wherein M stands for at least one element selected from the group consisting of Fe, Co, and Ni) with a face-centered cubic crystal structure.

The exchange coupling film of this invention is further characterized in that the film thickness, $t_{AF1}$, of the first antiferromagnetic film and the film thickness, $t_{AF2}$, of the second antiferromagnetic film fall in the respective ranges of 3 nm$\leq t_{AF1} \leq$50 nm and 0 nm$< t_{AF2} \leq$5 nm and the Néel temperature, $T_N1$, of the first antiferromagnetic film and the Néel temperature, $T_N2$ of the second antiferromagnetic film satisfy the expression, $T_N2 < T_N1$.

Further, the magnetoresistance effect element of this invention is characterized in that the exchange coupling film mentioned above and an electrode for supplying an electric current to at least the ferromagnetic film in the exchange coupling film are formed on a substrate.

The present inventors have perfected this invention after finding the fact that the exchange coupling film in which the first antiferromagnetic film has a crystal structure of tetragonal, body-centered cubic, or NaCl and the second antiferromagnetic film formed in the interface between the first antiferromagnetic film and the ferromagnetic film has a crystal structure of face-centered cubic possesses a large exchange bias magnetic field and exhibits a fully satisfactory thermal stability.

In this invention, the large exchange bias magnetic field is obtained by forming in the interface between the ferromagnetic film and the first antiferromagnetic film the second antiferromagnetic film having a crystal structure different from that of the first antiferromagnetic film as described above. This is because the coupling force between the first antiferromagnetic film and the ferromagnetic film can be exalted through the medium of the second antiferromagnetic film, whereas no sufficient magnetic coupling is formed in the interface between the first antiferromagnetic film and the ferromagnetic film and no large bias magnetic field is obtained consequently. The reason for the high thermal stability to be acquired by the exchange coupling film of this invention is that the blocking temperature, $T_B$, at which the exchange bias reaches zero is substantially determined in the superposed antiferromagnetic film of this invention by the second antiferromagnetic film having a high value of $T_B$ because the film thickness of the first antiferromagnetic film is small as compared with that of the second antiferromagnetic film and further because the blocking temperature, $T_B$, is determined by the whole antiferromagnetic film and not by the interface.

The first antiferromagnetic film according to this invention which has a crystal structure selected from the group consisting of tetragonal, body-centered cubic, and NaCl type is preferably formed of a QMn alloy, a CrM' alloy, or an oxide such as NiO or CoO, wherein Q stands for at least one element selected from the group consisting of Fe, Co, Ni, Cu, Ru, Rh, Re, Ag, Au, Os, Ir, Pd, and Pt and M' for at least one element selected from the group consisting of Mn, Fe, Co, Ni, Cu, Ru, Rh, Re, Ag, Au, Os, Ir, Pd, and Pt.

The film thickness of the first antiferromagnetic film ($t_{AF1}$) is preferably in the range of 3 nm$\leq t_{AF1} \leq$50 nm for the purpose of imparting a large anisotropic and exchange bias magnetic field to the ferromagnetic film. If the film thickness of the first antiferromagnetic film ($t_{AF1}$) is less than 3 nm, the ferromagnetic film will not easily acquire a fully high anisotropic magnetic field. If it exceeds 50 nm, the crystallinity of the antiferromagnetic film will be degraded because the influence from the second antiferromagnetic film is weakened and the film stress on the ferromagnetic film will be increased. Consequently the exchange bias magnetic field will weaken. More preferably, the film thickness is in the range of 5 nm$\leq t_{AF1} \leq$20 nm.

The second antiferromagnetic film according to the present invention is formed in the interface between the first antiferromagnetic film and the ferromagnetic film. The crystal structure thereof is formed of a $\gamma$ phase M-Mn alloy of face-centered cubic and the film thickness ($t_{AF2}$) thereof is preferably in the range of 0 nm$<t_{AF2}\leq$5 nm. The symbol M used in the $\gamma$ phase M-Mn alloy stands for at least one metal selected from the group consisting of Fe, Co, and Ni. This alloy may further incorporate therein a noble metal such as, for example, Cu, Ru, Rh, Re, Ag, Au, Os, or Ir for the purpose of controlling the degree of crystal matching between the ferromagnetic film and the first antiferromagnetic film and the Néel temperature. If this film thickness ($t_{AF2}$) exceeds 5 nm, the blocking temperature, $T_B$, will be unduly lowered and the increase of the exchange bias magnetic field due to the synergistic effect between the first and the second antiferromagnetic film will not be attained as expected. Conversely, if the film thickness ($t_{AF2}$) is less than 0.3 nm, film preparation becomes difficult. More preferably, the film thickness of the second antiferromagnetic film is in the range of 0.3 nm$\leq t_{AF2}\leq$5 nm.

This invention permits increase of the blocking temperature ($T_B$) at which the exchange bias magnetic field reaches zero by setting the Néel temperature ($T_N1$) of the first antiferromagnetic film and the Néel temperature ($T_N2$) of the second antiferromagnetic film so as to satisfy the relation, $T_N2<T_N1$. If the Néel temperature ($T_N1$) of the first antiferromagnetic film and the Néel temperature ($T_N2$) of the second antiferromagnetic film are so set as to have the relation, $T_N1\leq T_N2$, the increase of the blocking temperature will not be conspicuous and the thermal stability will not be significantly improved. Generally, the exchange coupling film, when suffered to surpass the blocking temperature, no longer functions as an exchange coupling film owing to the loss of its exchange bias magnetic field and necessitates repetition of a treatment in a magnetic field. To maintain ideal thermal stability, therefore, the exchange coupling film of the present invention preferably has a blocking temperature of not less than 200° C. To satisfy the relation, $T_N2<T_N1$, $T_N1$ preferably ought to be not less than 230° C.

In the exchange coupling film of this invention, the term "ferromagnetic film" means a film which is expected to possess ferromagnetism whose magnitude is not particularly limited. In order for the exchange coupling film to be used effectively in a magnetoresistance effect element, the ferromagnetic film thereof is preferably a thin alloy film or an artificial lattice film with giant magnetoresistance, which is made of Permalloy, an alloy of the ferromagnetic metal such as, for example, $Fe_xNi_{100-x}$, $Fe_xCo_{100-x}$, or $Fe_xCo_yNi_{100-x-y}$, or an alloy formed by adding to the alloy mentioned above a third element or a fourth element for the purpose of improving magnetic properties.

The exchange coupling film of this invention is prepared by the use of any of the known film preparation methods such as, for example, vacuum evaporation, sputtering method, and MBE method. In this case, the film may be formed in a magnetic field or it may be heat-treated in a magnetic field for the purpose of imparting uniaxial magnetic anisotropy to the antiferromagnetic film.

Further, in the magnetoresistance effect element of this invention, it is desirable that the first antiferromagnetic film be in contact with part of the second antiferromagnetic film and the electroconductive electrode be formed on the part of the second antiferromagnetic film which is not in contact with the first antiferromagnetic film. The first and the second antiferromagnetic film are required herein for the purpose of imparting a large exchange bias magnetic field with a fully satisfactory exchange bias magnetic field to the ferromagnetic film and the electrode is a component necessary for the detection of the signal of a change in the magnetic resistance corresponding to a change in the magnetic field.

The substrate to be used herein is not particularly limited but may be an amorphous substrate made of glass or resin or a single crystal substrate, an oriented substrate, or a sintered substrate made of Si, MgO, sapphire, or a various ferrite. The substrate may be further provided with an undercoating layer of a thickness in the range of from 1 to 100 nm for the purpose of improving the crystallinity of the antiferromagnetic film or the ferromagnetic film. This undercoating layer has no particular limit except for the requirement that it be capable of improving the crystallinity. Thus, it may be made of a noble metal such as, for example, Pd or Pt, or an amorphous alloy such as CoZrNb. The exchange coupling film of this invention, accordingly, can be utilized for various devices which use magnetoresistance effect elements such as, for example, a magnetic field detecting sensor and a regenerating magnetic head.

DESCRIPTION OF THE PREFERRED EMBODIMENTS

Now, working examples of this invention will be described below with reference to the drawings.

EXAMPLE 1

Figure 1:
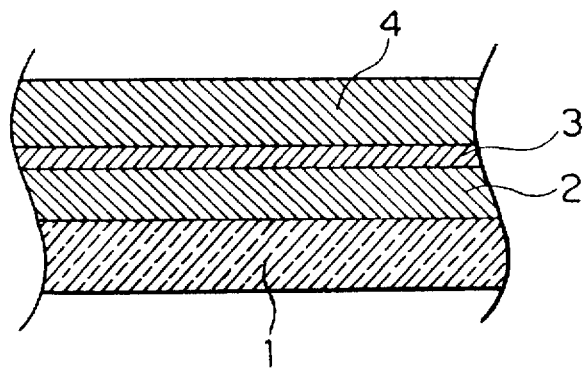
FIG. 1 is a cross section of an exchange coupling film of Example 1.

An exchange coupling film having a second antiferromagnetic film formed in the interface between a first antiferromagnetic film and a ferromagnetic film was prepared by the use of an RF magnetron sputter device. The cross section of this exchange coupling film is shown in FIG. 1. This exchange coupling film was produced in a static magnetic field by superposing on a substrate 1 made of glass a ferromagnetic film 2 of a composition of $Co_{90}Fe_{10}$ (90 at % Co10 at % Fe) in a thickness of 10 nm and a first antiferromagnetic film 4 of a composition of $Ni_{50}Mn_{50}$ having a crystal structure of tetragonal in a thickness of 15 nm and forming a second antiferromagnetic film 3 of a composition of $\gamma\text{-}Fe_{50}Mn_{50}$ in a varying thickness in the range of from 0 to 15 nm in the interface between the ferromagnetic film 2 and the first antiferromagnetic film 4 as shown in the diagram. The substrate was not particularly given a heat treatment.

Figure 2:
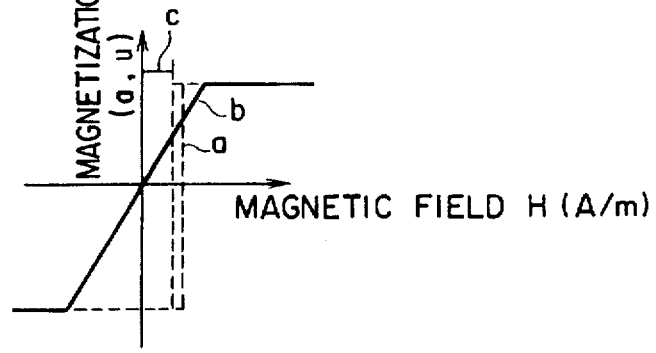
FIG. 2 is a diagram showing a magnetization curve of Example 1.

For the sake of comparison, a magnetization curve for an easy axis of magnetization (a) (the direction of the magnetic field during the film formation) and for a hard axis of magnetization (b) obtained of an exchange coupling film which omitted the formation of the second antiferromagnetic film in the interface is shown in FIG. 2. The difference c between the magnitudes of the two magnetic fields obtained in the absence (0) of magnetization forms the exchange bias magnetic field (Hua).

Figure 3:
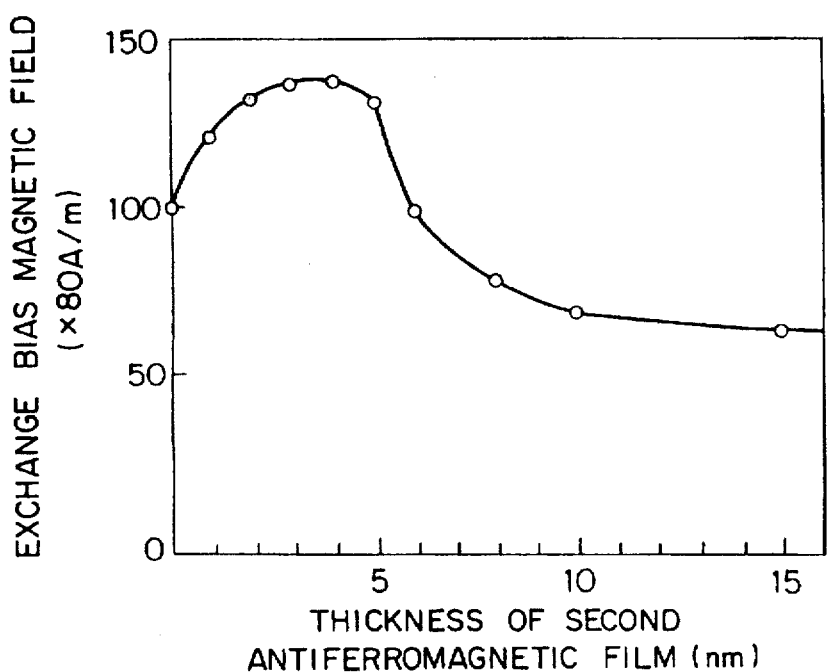
FIG. 3 is a diagram showing the relation between the film thickness of a second antiferromagnetic film and the exchange bias magnetic field in Example 1.

The relation between the film thickness of the second antiferromagnetic film and the exchange bias magnetic field in the exchange coupling film of Example 1 is shown in FIG. 3. It is remarked from FIG. 3 that the exchange bias magnetic field is so large as to exceed 9500 (A/m) when the second antiferromagnetic film ($\gamma\text{-}Fe_{50}Mn_{50}$) is formed in a thickness of not less than 1 nm in the interface between the first antiferromagnetic film ($Ni_{50}Mn_{50}$) and the ferromagnetic film ($Co_{90}Fe_{10}$).

It is further noted from the diagram that the magnitude of the exchange bias magnetic field is decreased and the effect of forming the second antiferromagnetic film in the interface is nullified when the thickness of the second antiferromagnetic film exceeds 5 nm.

When the exchange coupling film obtained as described above was analyzed by the X-ray diffraction to determine the crystallinity of the film, it was confirmed that the formation of the second antiferromagnetic film in the interface between the first antiferromagnetic film and the ferromagnetic film resulted in markedly enhancing the crystallinity of the film. It is inferred that this improvement of the crystallinity contributes to increase the exchange bias magnetic field.

Exchange coupling films were prepared by following the procedure described above while using for the first antiferromagnetic film antiferromagnetic films of such alloys as $Co_xMn_{100-x}$ (10<x<50) and $Pd_xMn_{100-x}$ (40≦x≦60) having a crystal structure of tetragonal and an antiferromagnetic films of such alloys as $Cr_{95}Mu_5$ and $Cr_{98}Mn_2$ having a crystal structure of body-centered cubic in the place of $Ni_{50}Mn_{50}$. When these exchange coupling films were tested for exchange bias magnetic field, they showed the same increases in exchange bias magnetic field as in the exchange coupling film using the NiMn alloy.

EXAMPLE 2

Exchange coupling films were prepared by following the procedure of Example 1 while using a $Co_{83}Fe_9Pd_8$ alloy for the ferromagnetic film, a NiO film of 15 nm in thickness for the first antiferromagnetic film, and a $\gamma\text{-}Fe_{50}Mn_{50}$ film of a varying thickness in the range of from 0 to 15 nm for the second antiferromagnetic film formed in the interface. The relation between the thickness of the second antiferromagnetic film and the exchange bias field magnetic field is shown in FIG. 4.

Figure 4:
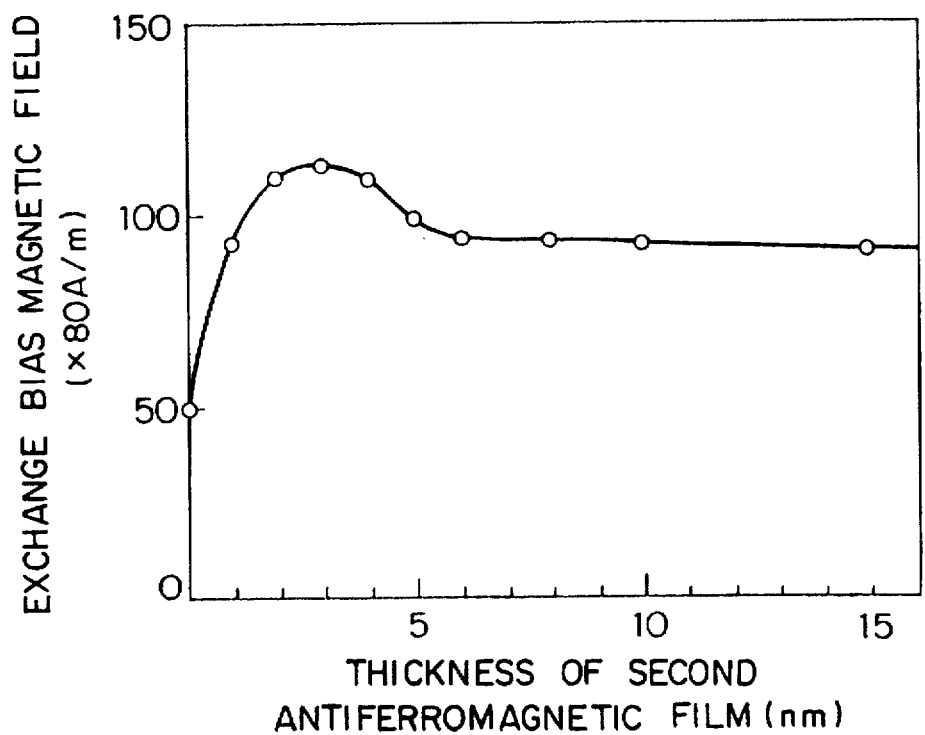
FIG. 4 is a diagram showing the relation between the film thickness of a second antiferromagnetic film and the exchange bias magnetic field in Example 2.

It is confirmed by the data of FIG. 4 that the exchange bias magnetic field is increased so much as to exceed 6400 (A/m) when the thickness of the second antiferromagnetic film is more than 1 nm.

Exchange coupling films were manufactured by following the procedure described above while using such γ phase M-Mn alloys as $\gamma\text{-}CO_xMn_{100-x}$ (50≦x≦65) and $\gamma\text{-}Fe_{65}(Ni_{0.33}Mn_{0.67})_{35}$ alloy and alloys obtained by adding such noble metals as Cu, Pd, Pt, and Au at a ratio of 5 at % to the alloys mentioned above for the second antiferromagnetic film in the place of $\gamma Fe_{50}Mn_{50}$. When these exchange coupling films were tested for exchange bias magnetic field, they showed the same increases in exchange bias magnetic field as in the exchange coupling film using the γ-FeMn alloy.

EXAMPLE 3

An exchange coupling film having a relatively large exchange bias magnetic field was prepared by following the procedure of Example 2 while using a $\gamma\text{-}Fe_{50}Mn_{50}$ alloy for the second antiferromagnetic film, NiO for the first antiferromagnetic film, and a CoFe alloy for the ferromagnetic film instead. This exchange coupling film was applied to the spin valve film composed of exchange-biased ferromagnetic layer, nonmagnetic layer, and soft magnetic film.

Figure 5:
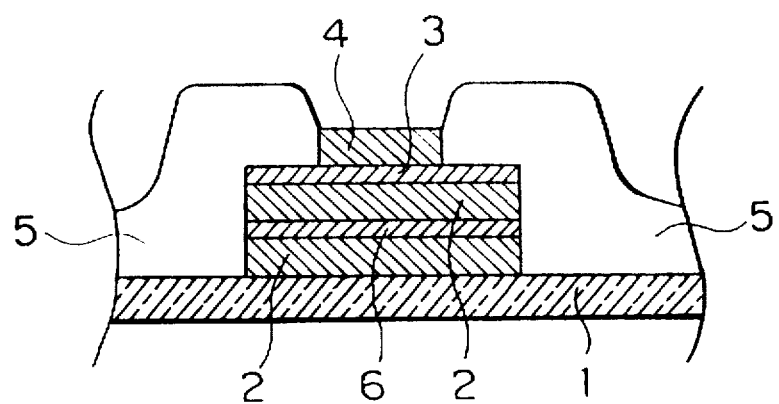
FIG. 5 is a cross section of a magnetic field detecting sensor in Example 3.

The cross section of a magnetic field detecting sensor, one of the magnetoresistance effect elements specifically manufactured in this example, is shown in FIG. 5. A glass sheet (marketed by Corning Japan K.K. under product code of "#7059") was used for the substrate 1. An alloy of $Co_{90}Fe_{10}$ of a thickness of 7 nm for the ferromagnetic film 2, an oxide NiO of a thickness of 15 nm for the first antiferromagnetic film 4, an alloy of $\gamma\text{-}Fe_{50}Mn_{50}$ of a thickness of 5 nm for the second antiferromagnetic film 3, a Cu film of a thickness of 3 nm for the nonmagnetic layer 6, and a Cu sheet of a thickness of 0.3 μm for electrodes 5 were used. The distance between the electrodes 5 was 50 μm and the width of the element was 8 μm. The ferromagnetic film 2, the second antiferromagnetic film 3, and the first antiferromagnetic film 4 were formed in a magnetic field to apply uniaxial anisotropy. The magnetic field detecting sensor was fabricated by treating the element by a standard fine-patterning process so as to orient the uniaxial anisotropy in the direction of length of the element. The sensor was subsequently annealed in a magnetic field (the direction thereof coinciding with the direction of width of the element) at 200° C. for 10 minutes so as to have an exchange bias magnetic field imparted to the element in the direction of width thereof.

When a magnetic field was externally applied to this magnetic field detecting sensor to examine the response thereof to the magnetic field, it manifested an exchange bias magnetic field and an output sensitivity at levels equal to or higher than those manifested by a conventional magnetic field detecting sensor manufactured by using a $\gamma\text{-}Fe_{50}Mn_{50}$ alloy alone for an antiferromagnetic film which was provided with a protective film such as of Ti.

EXAMPLES 4 THROUGH 9 AND COMPARATIVE EXAMPLE 1

Exchange coupling films were prepared by following the procedure of Example 1 using the same RF magnetron sputter device while forming a second antiferromagnetic film in the interface between a first antiferromagnetic film and a ferromagnetic film. A $Ni_{79}Fe_{16}Co_5$ alloy was used for the ferromagnetic film. For the first antiferromagnetic film, a $Pd_{56}Mn_{44}$ alloy (Example 4), A $Pt_{59}Mn_{41}$ alloy (Example 5, a $Ni_{50}Mn_{50}$ alloy (Example 6), a $Cr_{92}Pt_8$ alloy (Example 7), a $Cr_{97}Ir_3$ alloy (Example 8), and an oxide NiO (Example 9) were respectively used in a fixed thickness of 15 nm. In the interface, a $\gamma$-$Fe_{50}Mn_{50}$ alloy was deposited in a thickness of 5 nm as the second antiferromagnetic film.

The exchange coupling films of the examples mentioned above were tested to find their blocking temperatures ($T_B$) at which their exchange bias magnetic fields reached zero. The results of the test are shown together with the Néel temperatures and crystal structures of their antiferromagnetic films. In Comparative Example 1, an exchange coupling film was manufactured by following the procedure described above while using a $\gamma$-$Fe_{50}Mn_{50}$ alloy sheet of a thickness of 20 nm for a single antiferromagnetic film. This exchange coupling film was similarly tested for blocking temperature. The results are shown in Table 1.

TABLE 1

| | First antiferromagnetic film | | Second antiferromagnetic film | | Blocking temp. TB (°C.) |
|---|---|---|---|---|---|
| | Composition | $T_N1$ (°C.) | Composition | $T_N1$ (°C.) | |
| Example 4 | $Pd_{56}Mn_{44}$ | 560 | $Fe_{50}Mn_{50}$ ($\gamma$ type) | 229 | 260 |
| 5 | $Pt_{59}Mn_{41}$ | 542 | | | 250 |
| 6 | $Ni_{50}Mn_{50}$ | 800 | | | 265 |
| 7 | $Cr_{92}Pt_8$ | 357 | | | 230 |
| 8 | $Cr_{97}Ir_3$ | 307 | | | 200 |
| 9 | Nio | 247 | | | 160 |
| Comparative example 1 | None | | $Fe_{50}Mn_{50}$ ($\gamma$ type) | 229 | 140 |

Note 1:
The first antiferromagnetic films of Examples 4, 5, and 6 had crystal structures of tetragonal.
Note 2:
The first antiferromagnetic films of Examples 7 and 8 had crystal structures of body-centered cubic.
Note 3:
The first antiferromagnetic film of Example 9 had a crystal structure of NaCl type.
Note 4:
The $Fe_{50}Mn_{50}$ ($\gamma$ type) film has a crystal structure of face-centered cubic.

It is clearly noted from Table 1 that the exchange coupling films according to this invention showed markedly increased blocking temperatures and excellent thermal stability.

This invention allows provision of an exchange coupling film which is possessed of a large exchange bias magnetic field and consequently enabled to acquire improved thermal stability. The magnetoresistance effect elements which are contemplated by the present invention are enabled to produce stable outputs, prevented from generating a Barkhausen noise, and allowed to enjoy an immense economic value because they use the exchange coupling film of the quality mentioned above.

EXAMPLE 10

An exchange coupling film having a relatively large exchange bias magnetic field was prepared by following the procedure of Example 2 while using a $\gamma$-$Fe_{50}Mn_{50}$ alloy for the second antiferromagnetic film, an $Ir_{50}Mn_{50}$ alloy for the first antiferromagnetic film, and a CoFe alloy for the ferromagnetic film. This exchange coupling film was used for a spin valve film mentioned above in Example 3.

Figure 6:
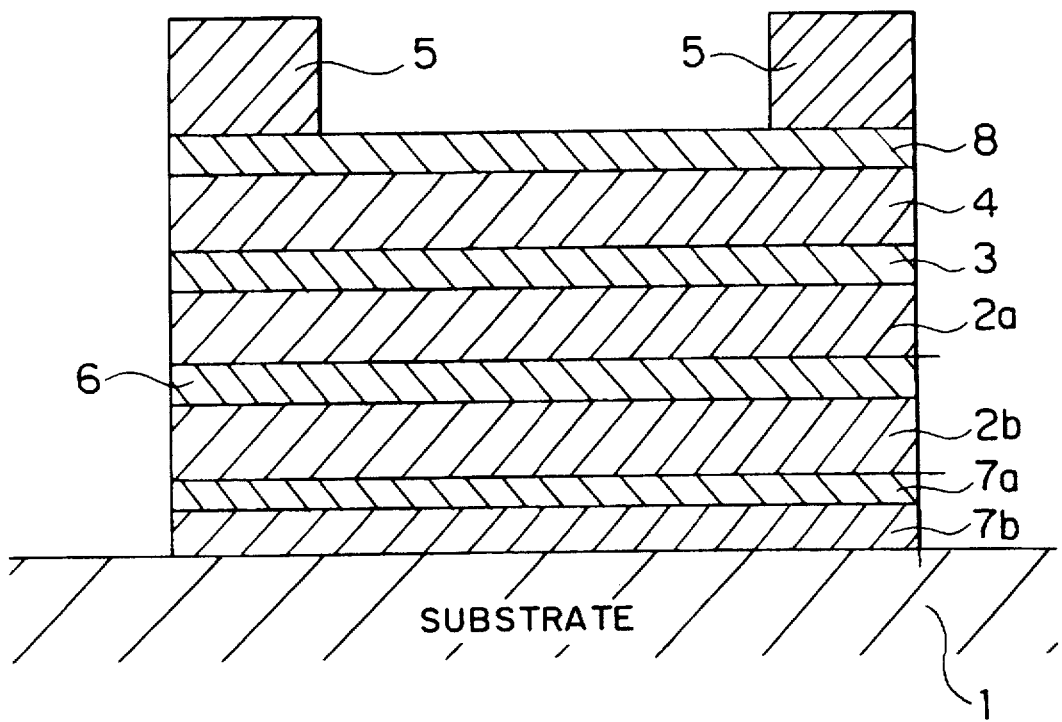
FIG. 6 is a cross section of a magnetic field detecting sensor in Example 10.

The cross section of a magnetic field detecting sensor, one of the magnetoresistance effect elements specifically manufactured in this example, is shown in FIG. 6.

Thermally oxidized silicon was used for the substrate 1, a $Co_{90}Fe_{10}$ alloy film of a thickness of 4 nm for the ferromagnetic films 2a and 2b, an $Ir_{50}Mn_{50}$ alloy film of a thickness of 15 nm for the first antiferromagnetic film 4, a $\gamma$-$Fe_{50}Mn_{50}$ alloy film of a thickness of 3 nm for the second antiferromagnetic film 3, a Cu sheet of a thickness of 2 nm for a nonmagnetic film 6, and a Cu film of a thickness of 0.3 μm for the electrodes 5. In addition, a ferromagnetic undercoating film consisting of a CoZrNo amorphous film 7b and a NiFe film 7a was interposed between the substrate 1 and the ferromagnetic film 2b and a protective film 8 was interposed between the electrodes 5 and the antiferromagnetic film 4. The distance between the electrodes 5 was 30 μm and the width of the element was 8 μm. The ferromagnetic film 2, the second antiferromagnetic film 3, and the first antiferromagnetic film 4 were formed in a magnetic field to be vested with uniaxial anisotropy. The magnetic field detecting sensor was obtained by treating the element by a standard semiconductor process so as to orient the uniaxial anisotropy in the direction of length of the element. The sensor was subsequently annealed in a magnetic field (the direction thereof coinciding with the direction of width of the element) at 220° C. for 10 minutes so as to have an exchange bias magnetic field imparted to the element in the direction of width thereof.

When a magnetic field was externally applied to the produced magnetic field detecting sensor to examine the response thereof to the magnetic field, it manifested an exchange bias magnetic field and an output sensitivity at levels equal to or higher than those manifested by a conventional magnetic field detecting sensor manufactured by using a $\gamma$-$Fe_{50}Mn_{50}$ alloy alone for an antiferromagnetic film which was provided with a protective film such as of Ti.

What is claimed is:

1. An exchange coupling film comprising a first antiferromagnetic film, a ferromagnetic film superposed on said first antiferromagnetic film, and a second antiferromagnetic film formed in the interface between said first antiferromagnetic film and said ferromagnetic film, said first antiferromagnetic film having a crystal strcuture selected from the group consisting of tetragonal, body-centered cubic, and NaCl crystal structure, and said second antiferromagnetic film being formed of a $\gamma$ phase M-Mn alloy having a crystal structure of face-centered cubic and having a film thickness of not more than 5 nm, wherein M stands for at least one element selected from the group consisting of Fe, Co, and Ni.

2. The exchange coupling film according to claim 1, wherein the film thickness, $t_{AF1}$, of said first antiferromagnetic film and the film thickness, $t_{AF2}$, of said second antiferromagnetic film fall in the respective ranges of 3 nm$\leq t_{AF1} \leq$50 nm and 0 nm$<t_{AF2}\leq$5 nm.

3. The exchange coupling film according to claim 1, wherein and the Néel temperature, $T_N1$, of said first antiferromagnetic film and the Néel temperature, $T_N2$ of said second antiferromagnetic film satisfy the expression, $T_N2<T_N1$.

4. The exchange coupling film according to claim 1, wherein said first antiferromagnetic film is made of at least one alloy selected from the group consisting of a QMn alloy, a CrM' alloy, a NiO alloy, and a CoO, wherein Q stands for at least one element selected from the group consisting of Fe, Co, Ni, Cu, Ru, Rh, Re, Ag, Au, Os, Ir, Pd, and Pt and M' for at least one element selected from the group consisting of Mn, Fe, Co, Ni, Cu, Ru, Rh, Re, Ag, Au, Os, Ir, Pd, and Pt.

5. A magnetoresistance effect element characterized by having formed on a substrate the exchange coupling film set forth in any of claims 1 through 4 and an electrode for passing an electric current to at least the ferromagnetic film in said exchange coupling film.

6. The exchange coupling film according to claim 2, wherein the thickness, $t_{AF1}$, of said first antiferromagnetic film is in the range of 5 nm$\leq t_{AF1} \leq$20 nm.

7. The exchange coupling film according to claim 2, wherein the thickness, $t_{AF2}$, of said second antiferromagnetic film is in the range of 0.3 nm$<t_{AF2}\leq$5 nm.

8. The exchange coupling film according to claim 1, wherein said exchange coupling film comprising a first antiferromagnetic film, a ferromagnetic film, and a second antiferromagnetic film has a blocking temperature of not less than 200° C.

9. The exchange coupling film according to claim 3, wherein the Néel temperature, $T_N1$, of said first antiferromagnetic film is not less than 230° C.

10. The magnetoresistance effect element according to claim 5, wherein the exchange coupling film, a nonmagnetic film, and another ferromagnetic film are superposed and the detection of a signal is effected by use of a change in resistance due to a spin-dependent scattering.

* * * * *

UNITED STATES PATENT AND TRADEMARK OFFICE
CERTIFICATE OF CORRECTION

PATENT NO. : 5,756,191
DATED : May 26, 1998
INVENTOR(S) : Hashimoto et al.

It is certified that error appears in the above-identified patent and that said Letters Patent is hereby corrected as shown below:

Claim 1, column 8, line 38, "strcuture" should read --structure--.

Signed and Sealed this

First Day of December, 1998

Attest:

BRUCE LEHMAN

*Attesting Officer*  *Commissioner of Patents and Trademarks*